(12) United States Patent
Grede et al.

(10) Patent No.: US 9,276,456 B2
(45) Date of Patent: Mar. 1, 2016

(54) GENERATING HIGH-FREQUENCY POWER FOR A LOAD

(71) Applicant: TRUMPF Huettinger GmbH + Co. KG, Freiburg (DE)

(72) Inventors: Andre Grede, Freiburg (DE); Daniel Krausse, Eichstetten (DE); Anton Labanc, Ehrenkirchen (DE); Christan Thome, Freiburg (DE); Alberto Pena Vidal, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 14/742,898

(22) Filed: Jun. 18, 2015

(65) Prior Publication Data

US 2015/0288274 A1 Oct. 8, 2015

Related U.S. Application Data

(63) Continuation of application No. PCT/DE2013/100429, filed on Dec. 18, 2013.

(30) Foreign Application Priority Data

Dec. 18, 2012 (DE) .......................... 10 2012 223 657
Dec. 18, 2012 (DE) .......................... 10 2012 223 662

(51) Int. Cl.
*H02M 1/08* (2006.01)
*H02M 7/5387* (2007.01)
(Continued)

(52) U.S. Cl.
CPC ................. *H02M 1/08* (2013.01); *H01J 37/24* (2013.01); *H01J 37/32082* (2013.01);
(Continued)

(58) Field of Classification Search
CPC ........................ H02M 1/08; H02M 2001/0003
USPC ........................................ 315/111.21; 363/123
See application file for complete search history.

(56) References Cited

U.S. PATENT DOCUMENTS

| 3,156,622 A | 11/1964 | Hill et al. |
| 4,003,003 A | 1/1977 | Heaberlin |

(Continued)

FOREIGN PATENT DOCUMENTS

| DE | 9210382 U1 | 11/1992 |
| DE | 60316022 T2 | 6/2008 |

(Continued)

OTHER PUBLICATIONS

"A Technical Tutorial on Digital Signal Synthesis", Analog Devices, 128 pages, 1999.

(Continued)

*Primary Examiner* — Don Le
(74) *Attorney, Agent, or Firm* — Fish & Richardson P.C.

(57) ABSTRACT

A power-supply system has a power converter configured to generate a high-frequency power signal and supply the high-frequency power signal to a load such as a plasma or gas laser process. The power converter includes a digital-to-analog converter (DAC) configured to generate an analog signal from a digital signal, an amplifier path in which the generated analog signal is amplified, and a logic-circuit unit coupled upstream of the DAC and configured to generate the digital signal and supply the generated digital signal to the DAC. The logic-circuit unit includes a signal-data buffer storing a signal-data value for generating a shape of the analog signal, an amplitude-data buffer storing an amplitude-data value for influencing an amplitude of the analog signal, and a multiplier configured to multiply the signal-data value by the amplitude-data value.

20 Claims, 2 Drawing Sheets

(51) Int. Cl.
*H03F 3/217* (2006.01)
*H01J 37/32* (2006.01)
*H01J 37/24* (2006.01)
*H03M 1/66* (2006.01)
*H05H 1/46* (2006.01)
*H02M 1/00* (2007.01)

(52) U.S. Cl.
CPC .... *H01J 37/32174* (2013.01); *H02M 7/53873* (2013.01); *H03F 3/2175* (2013.01); *H03M 1/66* (2013.01); *H02M 2001/0003* (2013.01); *H05H 2001/4682* (2013.01)

(56) References Cited

U.S. PATENT DOCUMENTS

| | | | |
|---|---|---|---|
| 4,053,848 A | 10/1977 | Kleische | |
| 4,700,315 A | 10/1987 | Blackburn et al. | |
| 5,477,188 A | 12/1995 | Chawla et al. | |
| 5,565,737 A | 10/1996 | Keane | |
| 5,729,145 A | 3/1998 | Blades | |
| 5,844,369 A | 12/1998 | Yoshizako et al. | |
| 5,939,886 A | 8/1999 | Turner et al. | |
| 5,982,099 A | 11/1999 | Barnes et al. | |
| 6,304,475 B1 | 10/2001 | Iwata et al. | |
| 6,316,756 B1 | 11/2001 | Thompson et al. | |
| 6,322,961 B1 | 11/2001 | Lam et al. | |
| 6,332,961 B1 | 12/2001 | Johnson et al. | |
| 6,384,540 B1 | 5/2002 | Porter et al. | |
| 6,522,121 B2 | 2/2003 | Coumou et al. | |
| 6,620,157 B1 * | 9/2003 | Dabney | A61B 18/1206 606/34 |
| 6,703,080 B2 | 3/2004 | Reyzelman et al. | |
| 6,707,255 B2 | 3/2004 | Coumou et al. | |
| 6,765,469 B2 | 7/2004 | Sortor | |
| 6,778,921 B2 | 8/2004 | Keane et al. | |
| 6,791,274 B1 | 9/2004 | Hauer et al. | |
| 6,819,052 B2 | 11/2004 | Kitamura et al. | |
| 7,115,185 B1 | 10/2006 | Gonzalez et al. | |
| 7,221,102 B2 | 5/2007 | Kotani et al. | |
| 7,304,438 B2 | 12/2007 | Kishinevsky | |
| 7,305,311 B2 | 12/2007 | van Zyl | |
| 7,477,711 B2 | 1/2009 | Kalvaitis et al. | |
| 7,489,145 B2 | 2/2009 | Matoba et al. | |
| 7,503,996 B2 | 3/2009 | Chen et al. | |
| 7,506,014 B2 | 3/2009 | Drummond | |
| 7,567,037 B2 | 7/2009 | Setsuhara et al. | |
| 7,702,702 B2 | 4/2010 | Tanaka et al. | |
| 7,767,053 B2 | 8/2010 | Takeda et al. | |
| 7,791,912 B2 | 9/2010 | Walde | |
| 7,822,565 B2 | 10/2010 | Brouk et al. | |
| 7,940,008 B2 | 5/2011 | Mattaboni et al. | |
| 7,970,562 B2 | 6/2011 | van Zyl | |
| 7,981,306 B2 | 7/2011 | Blattner et al. | |
| 8,842,704 B2 | 9/2014 | Schmelzer et al. | |
| 2003/0178943 A1 | 9/2003 | Espiau et al. | |
| 2003/0205460 A1 | 11/2003 | Buda | |
| 2005/0237035 A1 | 10/2005 | Reilly et al. | |
| 2007/0044715 A1 | 3/2007 | Blattner et al. | |
| 2007/0107844 A1 | 5/2007 | Bullock et al. | |
| 2007/0150819 A1 | 6/2007 | Goodman et al. | |
| 2008/0105538 A1 | 5/2008 | Winterhalter et al. | |
| 2008/0237031 A1 | 10/2008 | Sato | |
| 2009/0202741 A1 | 8/2009 | Stimson et al. | |
| 2010/0123502 A1 | 5/2010 | Bhutta et al. | |
| 2010/0141221 A1 | 6/2010 | Ilic et al. | |
| 2010/0276273 A1 | 11/2010 | Heckman et al. | |
| 2010/0296977 A1 * | 11/2010 | Hancock | A61L 2/14 422/186 |
| 2010/0327749 A1 | 12/2010 | Nitschke | |
| 2011/0241781 A1 | 10/2011 | Owen et al. | |

FOREIGN PATENT DOCUMENTS

| | | | |
|---|---|---|---|
| EP | 1753011 B1 | 5/2005 | |
| JP | 56141779 A | 11/1981 | |
| JP | 2000195698 A | 7/2000 | |
| JP | 2007149597 A | 6/2007 | |
| JP | 4071077 B2 | 4/2008 | |
| JP | 2009290678 A | 12/2009 | |
| JP | 4580560 B2 | 11/2010 | |
| WO | WO9535597 A1 | 12/1995 | |
| WO | WO2005078750 A1 | 8/2005 | |
| WO | WO2008150136 A1 | 12/2008 | |

OTHER PUBLICATIONS

Cushing, R., "Amplitude Modulation of the AD9850 Direct Digital Synthesizer", Analog Devices—Application Note AN-423, 2 pages.

Wikipedia: Definition of "Lookup Table", 7 pages, retrieved Jun. 16, 2015.

* cited by examiner

GENERATING HIGH-FREQUENCY POWER FOR A LOAD

CROSS-REFERENCE TO RELATED APPLICATIONS

This application is a continuation of and claims priority under 35 U.S.C. §120 to PCT Application No. PCT/DE2013/100429 filed on Dec. 18, 2013, which claimed priority to German Application No. DE 10 2012 223 657.0, filed on Dec. 18, 2012 and German Application No. DE 10 2012 223 662.7, filed on Dec. 18, 2012. The contents of all these priority applications are hereby incorporated by reference in their entirety.

TECHNICAL FIELD

The invention relates to methods, devices, and systems for generating a high-frequency power signal which can be supplied to a load, particularly by generating an analogue signal through a digital-to-analogue converter (DAC) and amplifying the analogue signal in an amplifier path.

BACKGROUND

Power-supply systems, especially systems which generate power at frequencies >1 MHz are used, for example, for laser excitation in plasma-coating plants or also for induction applications. In such power-supply systems, several amplifiers are often used, from which the total power of the power-supply system is generated. The power signals generated by the individual amplifiers are often not phase-synchronous. The power signals can also provide different amplitudes.

The output powers of the individual amplifiers, that is, the power signals, must often be combined to form a total power, for example, by combiners, or directly to a load, for example, a plasma electrode or a gas-laser electrode. In order to combine the output powers, fixed phase relationships of the output powers are often necessary. Furthermore, the output powers of the amplifiers should be matched with one another with regard to their amplitudes.

However, abrupt changes in the required power can occur in a power-supply system, for example, if an arc occurs in the plasma chamber, and the power supplied must be reduced in a correspondingly abrupt manner. It is also problematic and difficult with such systems to adjust the power and especially the level of ionization in the load.

SUMMARY

One aspect of the invention features a power-supply system has a power converter configured to generate a high-frequency power signal and supply the high-frequency power signal to a load such as a plasma or gas laser process. The power converter includes a digital-to-analogue converter (DAC) configured to generate an analogue signal from a digital signal, an amplifier path in which the generated analogue signal is amplified, and a logic-circuit unit coupled upstream to the DAC and configured to generate the digital signal and supply the generated digital signal to the DAC. The logic-circuit unit includes a signal-data buffer storing a signal-data value for generating a shape of the analogue signal, an amplitude-data buffer storing an amplitude-data value for influencing an amplitude of the analogue signal, and a multiplier configured to multiply the signal-data value by the amplitude-data value. The high-frequency power signal generated by the power converter can be rapidly and reliably adjusted, and the power supplied to the load can be adjusted correspondingly, e.g., at a level of ionization of a plasma in a plasma process.

Accordingly, a digital signal can be generated in a simple manner, which has information regarding a signal shape and an amplitude of the analogue signal to be generated in the DAC. In particular, a sequence of digital values can be generated by reading out a sequence of signal-data values stored in the signal-data buffer by a counter, by supplying the sequence of signal-data values to the multiplier, and multiplying the sequence of digital values in the multiplier by an amplitude-data value read out from the amplitude-data buffer.

In some implementations, several analogue signals are generated in parallel, which are then combined by a combiner, so that the signals to be combined can be matched with one another particularly readily and rapidly. Amplifier paths which are controlled with an analogue signal generated in this manner are particularly suitable for a parallel operation of several amplifier paths. The powers generated in this manner can be readily combined at the output of the amplifier paths. Accordingly, a total power of the power converter which can be matched very rapidly and accurately is obtained. In this specification, the load can include a plasma process or a gas-laser process.

A digital logic-circuit can be provided, which is connected to one or more logic-circuit units. The data values to be multiplied can be selected by the one or more logic-circuit units. The digital-logic circuit and the one or more logic-circuit units can be integrated in a logic module. This provides a high level of integration. Few components need to be used, which saves space and is cost favorable.

The tolerances of the individual amplifier paths, which occur through components and/or limited accuracy of reproducibility in manufacture, can be calibrated out. This allows the powers to be combined readily. This also allows cost saving in production, since the units do not all need to be calibrated individually. The speed advantage is achieved because of the fact that these calibration data can be stored in a buffer and used in parallel through an Field Programmable Gate Array (FPGA), that is, simultaneously, on all amplifier paths, when setting a new power value.

Furthermore, several mutually independent power converters or power generating systems can be synchronized with one another in phase and/or amplitude in this manner.

The synchronization can be controlled by varying the amplitude of the analogue signal supplied to one amplifier path. To be precise, the power converter is operated in different operating modes, especially in different operating classes. Accordingly, for low powers, for example, powers lower than 200 W, the power converter is kept in a linear operating mode, especially in operating class AB. For high powers, especially for powers greater than 800 W, the power converter is kept in a mode determined by switching processes, especially in an operating class E or F, by particular preference in an operating class "F inverse".

Another aspect of the invention features a method for generating a high-frequency power which can be supplied to a load, in which an analogue signal generated from a digital signal by an DAC is supplied to at least one amplifier path and amplified in the amplifier path to form a high-frequency power signal. The digital signal is generated by multiplying a signal-data value stored in a signal-data buffer by an amplitude-data value stored in an amplitude-data buffer. An analogue signal can be an analogue voltage.

In some examples, a sequence of digital values from which the DAC generates an analogue signal is supplied to a digital signal input of the DAC. In this manner, an analogue signal can be generated particularly rapidly and accurately.

The amplitude of the high-frequency power signals, that is, the amplitude of the output signal of each amplifier path, can be influenced by a specifiable amplitude of the analogue signal supplied to the respective amplifier path.

The analogue signal can be supplied directly to the amplifier path, and a variation of the amplitude of the analogue signal can lead directly to a variation in the amplitude of the high-frequency power signal of the amplifier path. The complexity with regard to hardware is especially reduced in this manner. Furthermore, this avoids the loss of amplitude information of the analogue signal which may then be generated again retrospectively.

Another aspect of the invention features a method for compensating tolerances in amplitude and phase of high-frequency power signals generated in various amplifier paths. A signal generated by a DAC, which is adjusted respectively in amplitude and phase by a higher-order digital buffer-control unit, can be supplied to each amplifier path. This can achieve a particularly good matching and calibration. The amplitude of each high-frequency power signal of each amplifier path can be influenced by the amplitude of the analogue signal generated by the DAC.

In some implementations, a first signal is supplied to a first amplifier path to generate a first output power; a second signal is supplied to the first amplifier path in to generate a second output power; a third signal is supplied to the second amplifier path to generate the first output power; and a fourth signal is supplied to the second amplifier path to generate the second output power. Amplitudes of the first, second, third and fourth signal can be stored in a buffer.

Another aspect of the invention features a method of generating a high-frequency power which can be supplied to a load by generating an analogue signal through a DAC and amplifying the analogue signal in an amplifier path. An amplitude of the analogue signal is modulated. In some examples, a plasma process or a gas-laser process comes under consideration as the load. Through the amplitude modulation of the analogue signal, the power which is delivered to the load can be controlled and, for example, the ionization level of a plasma in a plasma load can be adjusted and regulated in a particularly simple manner. The plasma load can be a processing plasma for etching or coating or also a plasma for the excitation of a gas-laser.

The amplitude of the analogue signal can be modulated by supplying a sequence of digital values to a digital signal input of the DAC, from which the DAC generates the analogue signal. In this manner, an analogue signal can be generated particularly rapidly and accurately.

The sequence of digital values can be generated by multiplying a signal-data value stored in a signal-data buffer by an amplitude-data value stored in an amplitude-data buffer. In particular, the sequence of digital values can be generated by reading out a sequence of signal-data values stored in a signal-data buffer by a counter, by supplying this sequence of signal-data values to a multiplier, and by multiplying the sequence of signal-data values in this multiplier by an amplitude-data value read out from an amplitude-data buffer. In this specification, an analogue signal can be an analogue voltage. Accordingly, a digital signal which comprises information regarding the signal shape and the amplitude of the analogue signal generated in the DAC can be generated in a simple manner. This is particularly advantageous if several analogue signals are generated in parallel, which are then combined by a combiner, so that the signals to be combined can be matched with one another in a particularly simple and rapid manner.

Amplifier paths which are controlled with an analogue signal generated in this manner are particularly suitable for a parallel operation of several amplifier paths. The powers generated in this manner can be readily combined at the output of the amplifier paths. This achieves a total power of a power converter which can be matched very rapidly and accurately.

The amplitude of the analogue signal can be modulated by varying the amplitude-data value stored in the amplitude-data buffer. Accordingly, the amplitude modulation can be implemented particularly rapidly. Furthermore, several amplifier paths can be varied very rapidly in this manner in output power and, at the same time, the synchronization of the amplifier paths with one another remains unaffected.

The amplitude of the analogue signal can be modulated by varying the signal-data value stored in the signal-data buffer.

The amplitude modulation can also be implemented very rapidly in this manner. Furthermore, several amplifier paths can also be varied very rapidly in their output powers, and a non-linear amplification and phase displacement with different amplitudes of the analogue signal of the amplifiers can be taken into account.

A reference signal can be supplied to a reference-signal input of the DAC to influence the analogue signal. In particular, the amplitude of the analogue signal can be modulated in this way. Accordingly, the analogue signal can be influenced not only by the sequence of digital values but also by a reference signal which is supplied to the reference-signal input. There are therefore several possibilities available for influencing and accurately adjusting the analogue signal, especially for modulating its amplitude.

A digital ramp function can be realized with a sequence of digital values. A digital ramp function is understood to be a gradient specified by digital values and a set value. For example, the digital ramp function can be specified that the power should be increased to 1 kW with a gradient of 100 W/ms.

Furthermore, it is possible to pulse between two amplitudes. This is possible in a particularly simple manner, because only information relating to the amplitude, phase and frequency needs to be supplied to the DAC. The realization of the pulsing with two amplitudes is therefore particularly simple and particularly fast. Accordingly, for example, in a simmering mode, the discharge can be maintained with a very low power without continuing a material-processing plasma process. A high level of ionization can be achieved much more rapidly by increasing the power in this manner than if it were necessary to reignite.

The analogue signal can be filtered. As a result, a signal with low harmonic content can be entered at the input of the amplifier path. This increases the efficiency of the overall system.

In each case, an analogue signal can be generated by several DACs and amplified respectively in an associated amplifier path. In this manner, relatively low powers can be generated in parallel amplifier paths which can then be combined to form a total power. Cost-favorable components can be used for the individual amplifier paths because of the relatively low powers generated.

The output signals of the amplifier paths can be combined in a combiner to form a total power. In this manner, a high output power of the power converter can be realized in a simple manner.

The signal-data buffer and the amplitude-data buffer can be written from a higher-order buffer. Accordingly, the higher-order buffer can determine and influence the content of the buffers associated with the DACs.

The DACs can be controlled taking into consideration signal delay times and amplification factors in the individual amplifier paths. Accordingly, a particularly accurate total power can be adjusted.

The total power generated and/or a power reflected from the load can be registered and supplied to a higher-order control. This allows a particularly accurate regulation and control of the total power.

Another aspect of the invention features a power-supply system with a power converter which can be connected to a load to supply the load with power. The power converter provides a first amplifier path, to which an amplitude-modulated analogue signal generated by a DAC is supplied. In particular, an especially rapid and flexible amplitude modulation, which can be exploited in plasma and laser applications, is achieved. The amplitude modulation of a power converter with arbitrary envelope is possible with the power-supply system according to the invention in order to control, for example, the level of ionization of the plasma.

A logic-circuit unit can be connected upstream of the DAC to generate a digital signal supplied to the DAC. The logic-circuit unit provides: a signal-data buffer in which signal-data values are stored in order to generate an analogue signal shape; an amplitude-data buffer in which amplitude-data values are stored in order to influence the amplitudes of the analogue signals; and a multiplier to multiply the signal-data values by the amplitude-data values.

Accordingly, a digital signal, which provides information regarding the signal shape and the amplitude of the analogue signal to be generated in the DAC, can be generated in a simple manner. In particular, the signal-data values can provide a phase information and/or a frequency information for the analogue signal to be generated.

At least two amplifier paths can be provided, where an analogue signal, generated in each case by a DAC from a digital signal, is supplied to each amplifier path, and a logic-circuit unit is connected upstream of every DAC. Consequently, a particularly compact construction is achieved for high output powers. Accordingly, manufacturing effort and costs can be saved. Furthermore, the construction is more reliable. Such a power converter can be calibrated and matched particularly readily.

A digital logic-circuit which is connected to the one or more logic-circuit units can be provided. The data values to be multiplied including the signal-data values and the amplitude-data values can be selected by the logic-circuit unit.

The digital logic-circuit and one or more logic-circuit units can be integrated in a logic module. A high degree of integration can be achieved. Few components need to be used, which saves space and is cost favorable.

The amplitude-modulated analogue signal can be a voltage, a current or a power. The term "amplitude" of a signal is taken here to mean a maximal deflection of a periodically moving alternating quantity.

The signal values and/or the amplitude values can be stored in look-up tables (LUT) and can be selected there particularly readily with regard to a signal shape and amplitude or respectively amplitude modulation to be adjusted.

The signal-data buffer and the amplitude-data buffer can be embodied as look-up tables (LUT). Accordingly, storage space can be saved, as only a short code is kept in the actual databases (with a large number of entries), and the associated long designation can be used from the table. Pre-calculated results or other information can be defined in the look-up table for given configurations. The calculation of values can therefore be dispensed with, so that the analogue signals, and therefore the power, can be matched extremely rapidly.

The DAC can provide a reference-signal input. The reference-signal input can be used to influence the generation of the analogue signal. A variation of the analogue signal can be brought about very rapidly in this manner.

A control circuit can be connected upstream of the reference-signal input. With the assistance of such a control circuit, the input signal of the reference-signal input can be varied rapidly in order to bring about a rapid variation of the analogue signal generated in this manner, especially its amplitude modulation.

A particularly compact construction is obtained if the DAC and the associated logic-circuit units are integrated in a Direct Digital Synthesis (DDS module).

If a filter arrangement for filtering the analogue signal is provided between the DAC and the amplifier path, a signal particularly low in harmonic content can be introduced at the input of the amplifier path. This reduces interfering harmonics in the amplifier path. This increases the efficiency of the overall system.

The power converter can provide more than two amplifier paths with which a DAC, which supplies an analogue signal to the respective amplifier path, is associated in each case. This results in a particularly compact construction for high output powers. Such a power converter can be matched particularly readily.

The amplifier paths can be connected to a combiner in order to combine the powers generated in the amplifier paths to form a total power. In this specification, relatively simple combiners can be used which are more favorable in manufacture but have strict requirements with regard to the phase position, amplitudes and frequencies of the input signals. As a result, the power converter can be built up with a particularly compact construction and in a cost favorable manner.

The combiner for combining the powers generated in the amplifier paths can be designed without compensating impedances for input signals of unequal strength and/or phase position. Such a combiner is particularly energy saving and cost favorable. Furthermore, a combiner of this kind can be constructed in a very compact manner and with few components.

The amplifier paths can provide transistors using LDMOS technology. LDMOS stands for "laterally diffused metal oxide semiconductor". These are MOSFETs which have hitherto been used primarily in the GHz range. The use of these transistors is so far unknown in the range below 200 MHz. In the case of a use in amplifiers for generating a power which can be supplied to a plasma process or a laser, it has been surprisingly shown that these transistors using LDMOS technology behave in a much more reliable manner than comparable, conventional MOSFETs. This may be attributable to a very much higher current-carrying capacity. In particular, in experiments with several amplifier paths and at frequencies of 3.4 MHz 13 MHz, 27 MHz, 40 MHz and 162 MHz, these transistor types have shown a particularly high reliability. A further advantage of these transistor types by comparison with conventional MOSFETs is that the identical transistors can be used for the named frequencies (3.4 MHz, 13 MHz, 27 MHz, 40 MHz and 162 MHz). Accordingly, amplifier systems and power-supply systems which can be used at frequencies over several decades in the range from 1 MHz up to 200 MHz can now be built up with a very similar or even with an identical topology. These are frequencies such as are often used in plasma processes and for gas-laser excitation. The frequency can be adjusted simply by varying the control of the DAC, the amplitude can be adjusted by varying the values in the digital buffer or respectively in the look-up tables or via the reference-signal input of the DACs. When driven at these frequencies in plasma processes, conventional MOSFETs often have problems if too much of the power supplied to the plasma process is reflected. Accordingly, the generated power must often be limited in order to prevent the reflected power from rising above a critical level. The plasma processes could not therefore always be securely ignited or operated within the desired power range. Furthermore, complex, controllable impedance-matching circuits were provided in order to resolve these disadvantages. LDMOS transistors can now be used in a particularly advantageous manner if reflected power is a significant factor, for example, in the case of the supply of plasma processes. In conjunction with the combiners mentioned above, the advantage of the LDMOS transistors is that very much larger reflected powers can be absorbed by the transistors. As a result, the requirements for additional impedance-matching networks connected between power-supply system and load are reduced and, costs for components and control can be saved with regard to these impedance-matching networks.

A dedicated DAC with an associated logic-circuit unit can be allocated to every amplifier path, where a higher-order buffer, especially a look-up table, connected to the logic-circuit unit associated with the DAC is provided. The buffers allocated to the DAC can be written from the higher-order buffer. An overall system is obtained which is suitable for very high powers and which can be realized in a compact construction. The system can be adjusted and matched very readily with regard to the output power.

The higher-order buffer can be integrated in the logic-circuit. Furthermore, the control circuit for the reference-signal input of at least one DAC can be integrated in the logic module, which can be embodied as a programmable logic device (PLD), especially a Field Programmable Gate Array (FPGA). The logic-circuit can be controlled by a digital signal processor.

In particular, the DACs can be integrated in this PLD or respectively FPGA. Furthermore, the control circuit for the reference-signal input of at least one DAC can be integrated in a PLD or respectively FPGA. The PLD or respectively FPGA can be controlled by a digital processor, especially by a digital signal processor (DSP). These integrations can contribute to the realization of a compact construction for high powers and the achievement of a very good matching of the power converters.

A measuring device, especially a directional coupler, can be provided, which is connected to a system control, which, in turn, controls the logic-circuit at least indirectly, especially via a digital processor or DSP. As a result, a very accurate and very rapid control of the power supplied to the plasma process can be realized.

The generated total power and/or a power reflected from a load, especially a plasma chamber, can be determined and supplied to a higher-order control. In this manner, the output power of the power converter can be controlled or regulated. This can also take place directly in the FPGA on a circuit board comprising FPGA, and DDS and possibly DSP.

Other advantages and advantageous embodiments of the subject-matter of the invention will be appreciated from the description, the claims and the drawings. The features mentioned above and those set out below may also be used individually per se or together in any combination. The embodiments shown and described are not intended to be understood to be a conclusive listing but are instead of exemplary character for describing the invention. The Figures of the drawings show the subject-matter according to the invention in a highly schematic manner and are not intended to be understood to be to scale.

DETAILED DESCRIPTION

Figure 1:
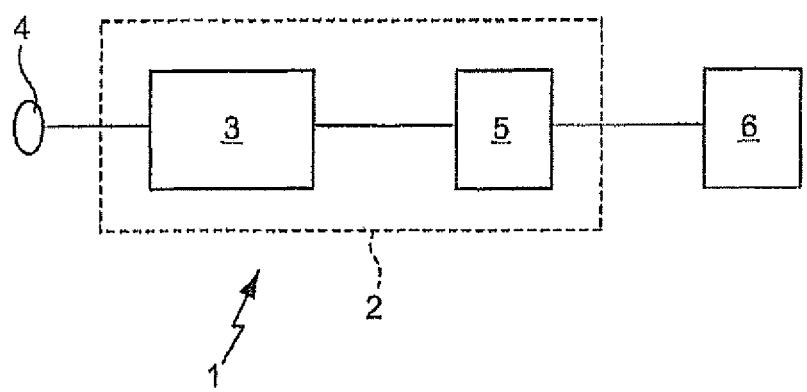
FIG. 1 is a schematic diagram of an example plasma system with an example power-supply system.

FIG. 1 shows a plasma system 1 which comprises a power-supply system 2. In turn, the power-supply system 2 provides a power converter 3 which can be connected to a voltage supply network 4. The power generated at the output of the power converter 3 is provided via an impedance-matching network 5 to a plasma chamber 6 as a load, where a plasma is generated, with the assistance of which a plasma processing can be implemented in the plasma chamber 6. In particular, a work-piece can be etched or a material layer can be applied to a substrate.

Figure 2:
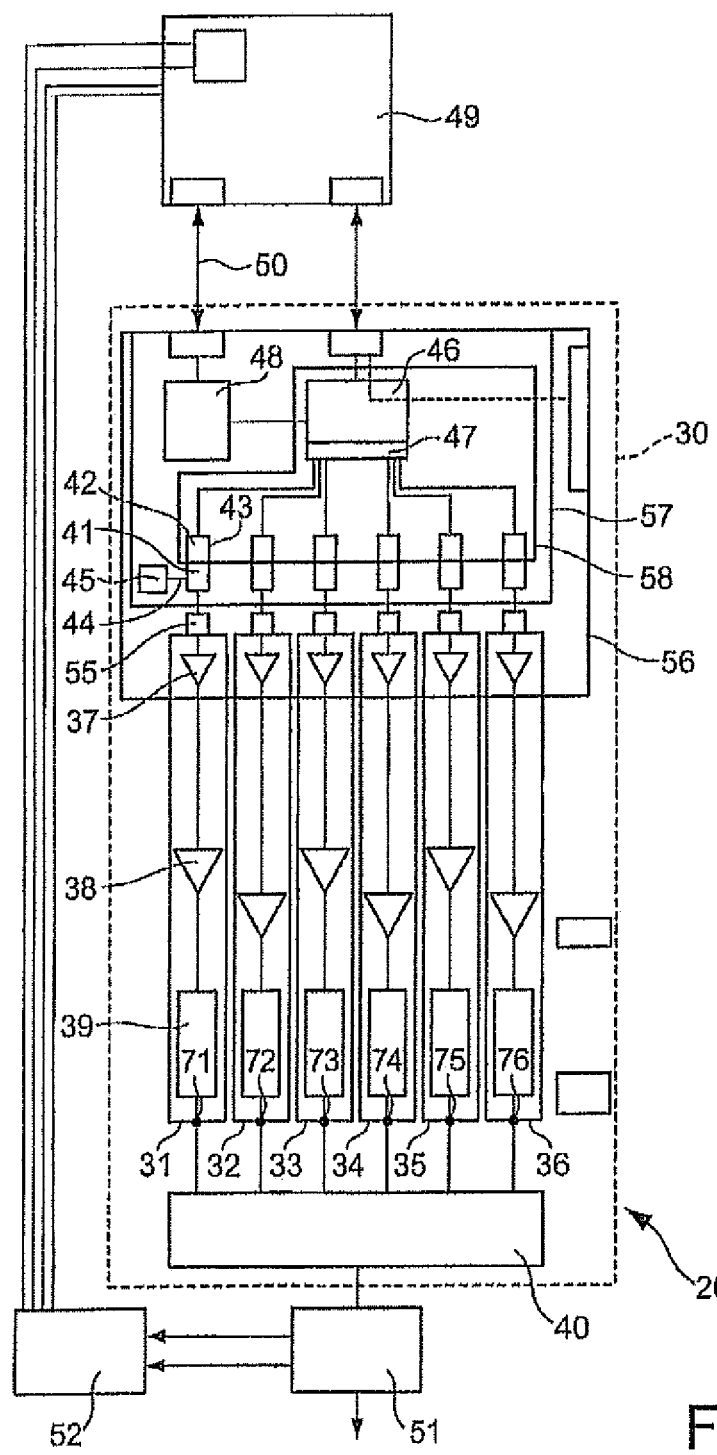
FIG. 2 is a block diagram of an example power-supply system.

FIG. 2 shows, in a highly schematic presentation, a power-supply system 20. The power-supply system 20 provides a power converter 30 which generates an output power, which can be supplied to a load, for example, a plasma process, or for a laser excitation. Several amplifier paths 31-36 are provided in the power converter 30. The amplifier paths 31-36 can be constructed as far as possible in an identical manner. For exemplary purpose, only the amplifier path 31 will be described below. The amplifier paths 31-36 provide several amplifiers 37, 38, which are suitable for amplifying an analogue signal. At the end of the amplifier paths 31-36, in each case, an amplifier 39 with at least one LDMOS transistor is provided, of which the output is connected directly or indirectly, for example, via an impedance-matching element and/or a filter, to a combiner 40. In particular, all outputs of all of the amplifier paths 31-36 are connected to the combiner 40, especially in an identical manner. The individual powers of the amplifier paths 31-36 are coupled by the combiner 40 to form a total power.

The fact that the amplifier paths 31-36 are constructed as far as possible in an identical manner does not necessarily mean that they provide the same amplification. Component scattering and tolerances in the construction of the circuits can lead to considerable differences in the phase and/or in the amplitude of the high-frequency power signals generated in the amplifier paths 31-36 with an identical input signal.

Figure 3:
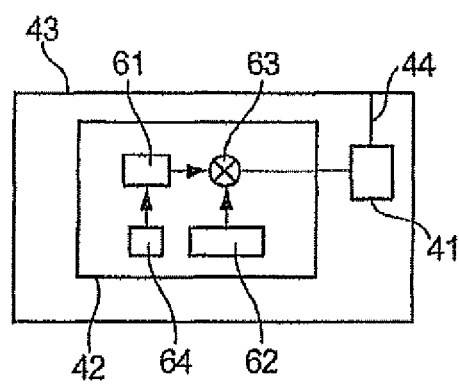
FIG. 3 is a block diagram of an example Direct Digital Synthesis (DDS) module.

In each case, a DAC 41, to which a logic-circuit unit 42 is allocated, is connected upstream of the amplifier paths 31-36. In particular, sequences of digital values from the logic-circuit unit 42 are supplied to the DAC 41, from which the DAC 41 generates an analogue output signal, which is supplied to an amplifier path 31, optionally after filtering through an optional filter 55. The DAC 41 and the logic-circuit unit 42 can be integrated in a so-called Direct Digital Synthesis module (DDS module) 43, also referred to as a Direct Digital Synthesizer. A dedicated DDS module 43 and, correspondingly, a DAC 41 and a logic-circuit unit 42 is associated with each of the amplifier paths 31-36. The DDS module 43 is described by way of example in FIG. 3.

Here, the logic-circuit unit 42 provides: a signal-data buffer 61 in which signal-data values for generating the analogue signal shape are stored, an amplitude-data buffer 62 in which amplitude-data values for influencing the amplitudes of the analogue signals are stored, a multiplier 63 for multiplying the signal-data values by the amplitude-data values, and a counter 64 which ensures that signal-data values are read out from the signal-data buffer 61 with a predetermined clock pulse and supplied to the multiplier 63. The signal-data buffer 61 and also the amplitude-data buffer 62 can be embodied as so-called look-up tables (LUT).

Furthermore, the DAC 41 provides a reference-signal input 44, upstream of which a control circuit 45 can be connected in order to generate a reference signal. The control circuit 45 can be realized in the digital logic-circuit (Programmable Logic Device, PLD) 46 which is still to be described. The digital logic-circuit can be embodied as a Field Programmable Gate Array (FPGA).

The output signal, that is, the generated analogue signal of the DAC 41, can be influenced, especially amplitude modulated, by the reference-signal supplied at the reference-signal input 44. The digital logic-circuit 46, which also provides a buffer 47 embodied as a look-up table (LUT), is connected upstream of the DDS module 43. Amplitude-data values which can be written from the buffer 47 to the amplitude-data buffer 62, can be stored in the buffer 47. An amplitude modulation can also be brought about through the choice of the amplitude-data values. Additionally, the data for the phase correction can also be stored. The values which are stored in the buffer 47 serve to compensate differences in the amplifier paths (31-36) or in combiners 40 connected downstream. They can be transferred to the logic-circuit unit 42, especially the amplitude-data buffer 62. The digital logic-circuit 46 is controlled by a digital processor, especially a digital signal processor (DSP) 48, which is connected to a system control 49 via a data bus 50.

The digital processor, especially the digital signal processor (DSP) 48, the buffer 47 and the logic-circuit units 42 can be realized in a logic module 58. The logic module can be embodied as a digital logic-circuit PLD, especially FPGA 58. If the DACs 41 are also integrated, a compact logic module 57 is achieved. The digital processor, especially the DSP 48, the buffer 47, the DDS modules 43 and also the DACs 41 and the filters 55 and the first amplifiers 37 can be realized on a printed circuit board 56. The identical printed circuit board 56 can be used for a plurality of different power-supply systems with different powers, different frequencies and/or different loads (laser, plasma etc.).

The output power of the combiner 40 is supplied via a measuring device embodied as a directional coupler 51 to a load, for example, a plasma process. The power emitted and a power reflected from the load can be determined by the directional coupler 51. The conditioning of the measurement signal is implemented with measurement apparatus 52 which are connected to the directional coupler 51. The measurement apparatus 52 are connected in turn to the system control 49. In this manner, via the system control 49, it can be determined, on the basis of the detected output power and the detected reflected power, which output power is to be generated from the combiner 40. Corresponding to this specification, the system control 49 can control the DSP 48, and, in turn, the DSP 48 can control the digital logic-circuit 46.

An arc detection can be realized in the measurement apparatus 52. To achieve a rapid response to an arc, the arc detection, that is, the measurement apparatus 52, can be connected directly to the DAC 41, especially its reference-signal input 44, or to the control circuit 45.

Digital values which contain amplitude information and also phase information, and optionally also frequency information, are stored in the buffer 47, so that an analogue signal with a specified amplitude, frequency and phase position can be generated at the output of the DAC 41. Accordingly, it is possible to match the output signals of the individual amplifier paths 31-36 with one another, so that the latter can be coupled in the combiner 40, especially for an improved output power. In particular, very simple combiners 40 can be used in this manner without loss-generating compensating impedances, and a power loss can be minimized.

As a result of the manner according to the invention of generating an analogue signal, the power at the output of the combiner 40 can be influenced and varied very rapidly.

A number of embodiments of the invention have been described. Nevertheless, it will be understood that various modifications may be made without departing from the spirit and scope of the invention. Accordingly, other embodiments are within the scope of the following claims.

What is claimed is:

1. A power-supply system comprising:
   a power converter configured to generate a high-frequency power signal and supply the high-frequency power signal to a load, the power converter comprising:
      a digital-to-analogue converter (DAC) configured to generate an analogue signal from a digital signal;
      an amplifier path in which the generated analogue signal is amplified; and
      a logic-circuit unit coupled upstream of the DAC and configured to generate the digital signal and supply the generated digital signal to the DAC, the logic-circuit unit comprising:
         a signal-data buffer storing a signal-data value for generating a shape of the analogue signal;
         an amplitude-data buffer storing an amplitude-data value for influencing an amplitude of the analogue signal; and
         a multiplier configured to multiply the signal-data value by the amplitude-data value.

2. The power-supply system of claim 1, further comprising a digital logic-circuit coupled to the logic-circuit unit.

3. The power-supply system of claim 1, wherein the DAC and the logic-circuit unit are integrated in a direct-digital synthesis (DDS) module.

4. The power-supply system of claim 1, wherein the power converter comprises:
   a plurality of DACs;
   a plurality of logic-circuit units each coupled upstream of a respective DAC of the plurality of DACs; and
   a plurality of amplifier paths each coupled to a respective DAC of the plurality of DACs,
   wherein each of the plurality of DACs is configured to:
      receive a respective digital signal from the respective logic-circuit unit,
      generate a respective analogue signal from the respective digital signal, and
      provide the generated respective analogue signal to the respective amplifier path.

5. The power-supply system of claim 4, further comprising:
   a combiner coupled to the plurality of amplifier paths and configured to combine power signals generated in the plurality of amplifier paths to provide a total power signal.

6. The power-supply system of claim 5, wherein the combiner is configured to combine the power signals generated in the plurality of amplifier paths without compensating impedances for the power signals having unequal strength or unequal phase position or both thereof.

7. The power-supply system of claim 1, wherein the amplifier path includes a laterally diffused metal oxide semiconductor (LDMOS) transistor.

8. The power-supply system of claim 1, wherein the DAC with the logic-circuit unit is associated with the amplifier path, and
wherein the power supply comprises a higher-level buffer coupled to the logic-circuit unit associated with the DAC.

9. The power-supply system of claim 1, wherein an amplitude of the analogue signal is modulated and supplied to the amplifier path.

10. The power-supply system of claim 9, configured to:
vary at least one of the signal-data value or the amplitude-data value,
generate the digital signal based on the varied at least one of the signal-date value or the amplitude-data value, and
generate the amplitude-modulated analogue signal from the digital signal.

11. The power-supply system of claim 1, comprising a driver circuit coupled upstream of a reference-signal input of the DAC.

12. The power-supply system of claim 1, coupled to a plasma chamber and configured to supply power to a plasma process.

13. A method of generating high-frequency power, comprising:
generating a digital signal by multiplying a signal-data value stored in a signal-data buffer by an amplitude-data value stored in an amplitude-data buffer;
generating, by a digital-to-analogue converter (DAC), an analogue signal from the digital signal; and
amplifying the analogue signal in at least one amplifier path to provide a high-frequency power signal.

14. The method of claim 13, further comprising modulating an amplitude of the analogue signal.

15. The method of claim 14, wherein modulating an amplitude of the analogue signal comprises supplying a sequence of digital values to a digital signal input of the DAC, and
wherein generating an analogue signal comprises generating the analogue signal from the sequence of digital values by the DAC.

16. The method of claim 15, further comprising:
generating the sequence of digital values by multiplying a sequence of signal-data values stored in the signal-data buffer by the amplitude-data value stored in the amplitude-data buffer.

17. The method of claim 14, wherein modulating the amplitude of the analogue signal comprises varying the amplitude-data value stored in the amplitude-data buffer.

18. The method of claim 14, wherein modulating the amplitude of the analogue signal comprises varying the signal-data value stored in the signal-data buffer.

19. The method of claim 14, wherein modulating an amplitude of the analogue signal comprises supplying a reference signal to a reference-signal input of the DAC to influence the analogue signal.

20. The method of claim 13, further comprising:
generating a plurality of analogue signals by a plurality of respective DACs; and
amplifying the plurality of analogue signals in a plurality of respective amplifier paths to provide respective high-frequency power signals.

* * * * *

UNITED STATES PATENT AND TRADEMARK OFFICE
CERTIFICATE OF CORRECTION

| | | |
|---|---|---|
| PATENT NO. | : 9,276,456 B2 | Page 1 of 1 |
| APPLICATION NO. | : 14/742898 | |
| DATED | : March 1, 2016 | |
| INVENTOR(S) | : Andre Grede et al. | |

It is certified that error appears in the above-identified patent and that said Letters Patent is hereby corrected as shown below:

In the Claims:

In column 11, line 14, in Claim 10, delete "signal-date" and insert --signal-data--.

Signed and Sealed this
Tenth Day of May, 2016

Michelle K. Lee
*Director of the United States Patent and Trademark Office*